United States Patent
Pu et al.

(10) Patent No.: US 10,735,014 B2
(45) Date of Patent: Aug. 4, 2020

(54) ERROR COMPENSATION CORRECTION DEVICE FOR PIPELINE ANALOG-TO-DIGITAL CONVERTER

(71) Applicant: CHINA ELECTRONIC TECHNOLOGY CORPORATION, 24TH RESEARCH INSTITUTE, Chongqing (CN)

(72) Inventors: Jie Pu, Chongqing (CN); Gang-yi Hu, Chongqing (CN); Dong-Bing Fu, Chongqing (CN); Xi Chen, Chongqing (CN); Xing-Fa Huang, Chongqing (CN); Yu-Xin Wang, Chongqing (CN); Guang-Bing Chen, Chongqing (CN); Ru-Zhang Li, Chongqing (CN)

(73) Assignee: CHINA ELECTRONIC TECHNOLOGY CORPORATION, 24TH RESEARCH INSTITUTE, Chongqing (CN)

( * ) Notice: Subject to any disclaimer, the term of this patent is extended or adjusted under 35 U.S.C. 154(b) by 0 days.

(21) Appl. No.: 16/475,120

(22) PCT Filed: Jun. 17, 2016

(86) PCT No.: PCT/CN2016/086097
§ 371 (c)(1),
(2) Date: Jun. 30, 2019

(87) PCT Pub. No.: WO2017/214955
PCT Pub. Date: Dec. 21, 2017

(65) Prior Publication Data
US 2019/0334538 A1 Oct. 31, 2019

(30) Foreign Application Priority Data
Jun. 14, 2016 (CN) .......................... 2016 1 0416838

(51) Int. Cl.
H03M 1/10 (2006.01)
H03M 1/06 (2006.01)

(52) U.S. Cl.
CPC ....... *H03M 1/1076* (2013.01); *H03M 1/0634* (2013.01)

(58) Field of Classification Search
CPC .............................. H03M 7/70; G06F 16/116
(Continued)

(56) References Cited

U.S. PATENT DOCUMENTS 6,304,204 B1 * 10/2001 Norman ................ H03M 1/069
341/118
6,606,042 B2 * 8/2003 Sonkusale ........... H03M 1/1004
341/118
(Continued)

FOREIGN PATENT DOCUMENTS

| CN | 101924554 A | 12/2010 |
| CN | 102025373 A | 4/2011 |
| CN | 102751990 A | 10/2012 |

*Primary Examiner* — Lam T Mai
(74) *Attorney, Agent, or Firm* — Cheng-Ju Chiang

(57) ABSTRACT

An error compensation correction device for a pipeline analog-to-digital converter includes a correction pipeline stage and a conventional pipeline stage. For each correction pipeline stage, a corresponding error estimation circuit, a level edge detection circuit, a random level generation circuit, and MUX circuit being provided. The present disclosure can track and correct non-ideal properties and mismatching errors in real time over time along with the change of the surroundings without interrupting the ADC normal work of the pipeline. Thus the correction value is closer to the real situation.

10 Claims, 8 Drawing Sheets

(58) Field of Classification Search
USPC ...................................... 341/55–90, 120–155
See application file for complete search history.

(56) References Cited

U.S. PATENT DOCUMENTS

| | | | | |
|---|---|---|---|---|
| 6,825,783 | B2 * | 11/2004 | You | H03M 1/069 |
| | | | | 341/118 |
| 8,791,844 | B2 * | 7/2014 | Meacham | H03M 1/0641 |
| | | | | 341/118 |
| 9,071,267 | B1 | 6/2015 | Schneider et al. | |
| 10,103,742 | B1 * | 10/2018 | Guo | H03M 1/145 |
| 2007/0290915 | A1 * | 12/2007 | Morimoto | H03M 1/0695 |
| | | | | 341/161 |
| 2008/0198055 | A1 * | 8/2008 | Matsubayashi | H03M 1/068 |
| | | | | 341/155 |
| 2011/0279295 | A1 * | 11/2011 | Li | H03M 1/0695 |
| | | | | 341/110 |
| 2013/0038477 | A1 * | 2/2013 | Souchkov | H03M 1/1057 |
| | | | | 341/120 |
| 2019/0280703 | A1 * | 9/2019 | Naru | H03M 1/164 |

\* cited by examiner ent application is a 35 U.S.C. § 371 National
ERROR COMPENSATION CORRECTION DEVICE FOR PIPELINE ANALOG-TO-DIGITAL CONVERTER

CROSS REFERENCE TO RELATED APPLICATIONS

The present application is a 35 U.S.C. § 371 National Phase conversion of International (PCT) Patent Application No. PCT/CN2016/086097, filed on Jun. 17, 2016, which further claims benefit of Chinese Patent Application No. 201610416838.8, filed on Jun. 14, 2016, the disclosure of which is incorporated by reference herein. The PCT International Patent Application was filed and published in Chinese.

TECHNICAL FIELD

The present disclosure relates to the field of integrated circuits, and in particular to an error compensation correction device for a pipeline analog-to-digital converter.

BACKGROUND

The circuit structure of an A/D (Analog/Digital) converter mainly has stepwise comparison structure, integral structure, flash structure, graded structure, pipeline structure and Δ-Σ oversampling structure and so on. The main circuit structure involved in high-speed and high-precision A/D converter is pipeline structure. The pipeline ADC (Analog-to-Digital Converter) is formed by the cascading of pipeline stages with the same structure under dual-phase non-overlapping clocks, except the last stage, each pipeline consists of an MDAC (Multiplying Digital to Analog Converter) formed by an operation amplifier (OPAMP) and a switch capacitor circuit and a comparator-based sub-ADC, and the pipeline stage has various factors such as non-ideal properties and mismatch errors and so on, which causes non-continuous hop points in the transmission curve and greatly limits the performance improvement of the high-speed high-precision pipeline ADC with the gradual shrinking of the process feature size becoming a main factor to limit the conversion precision of the pipeline ADC. It is very important to compensate and correct the errors with an effective correction technology to solve the effect of these errors to the performance of the pipeline ADC.

At present, the error compensation correction method of the pipeline analog-to-digital converter usually needs to interrupt the normal operation of the ADC to input a known test signal to acquire correction information, even so, there may be certain deviation between the error information extracted during test and the error information during practical operation, and at the same time, the change of the non-ideal properties and mismatch errors of the correction device over time and the surrounding environment (such as temperature change, component degradation, voltage change and so on) cannot be tracked; and at the same time, the normal operation interruption of the ADC during test and being different from the normal operation state of the ADC if the error measurement result has deviation cannot be avoided.

SUMMARY

The present disclosure provides an error compensation correction device for a pipeline analog-to-digital converter to solve the existing problem that the normal operation of the pipeline analog-to-digital converter needs to be interrupted and the correction accuracy is low when performing error compensation correction of the pipeline analog-to-digital converter.

According to a first aspect of the embodiments of the present disclosure, provided is an error compensation correction device for a pipeline analog-to-digital converter, comprising correction pipeline stages and conventional pipeline stages, a corresponding error estimation circuit, level edge detection circuit, random level generation circuit and MUX circuit being provided for each correction pipeline stage, wherein the level edge detection circuit is configured for detecting whether an output signal of a comparator in the correction pipeline stage is stably output within a preset time; the MUX circuit is configured for selecting the output signal of the comparator or an output signal of the random level generation circuit as an actual output signal of the comparator according to the detection result; and the error estimation circuit is configured for estimating a correction value of the correction pipeline stage according to the actual output signal and an encoding signal and a correction value signal of a subsequent pipeline stage when the output signal of the comparator is not stable within the preset time.

In an optional implementation, the error estimation circuit is configured for, with respect to each comparator in the correction pipeline stage the output signal of which is not stable within the preset time, determining the error amount of the comparator this time according to the actual output signal of the comparator and the encoding signal and the correction value signal of the subsequent pipeline stage; counting the correction value corresponding to the output signal of the comparator according to the determined error amounts; and after counting the correction values corresponding to the output signals of the comparators in the correction pipeline stage, determining the correction value of the correction pipeline stage according to the correction values corresponding to the output signals of the comparators in the correction pipeline stage.

In another optional implementation, the error estimation circuit is configured for determining the error amount of the comparator according to the following equation:

$$err(i, mux_i) = err(i, muxi) + \sum_{m=n+1}^{L} a_m \cdot b_m + \sum_{m=n+1}^{N} cal_m,$$

where err(i, $mux_i$) at the left of the equation represents the error amount determined by the i-th comparator in the n-th correction pipeline stage this time when the actual output signal of the i-th comparator is $mux_i$; err(i, $mux_i$) at the right of the equation represents the error amount determined by the i-th comparator in the n-th correction pipeline stage the last time when the actual output signal of the i-th comparator is muxi; $a_{n+1}$~$a_L$ represent the encoding signals of the subsequent pipeline stages after the n-th correction pipeline stage; $b_{n+1}$~$b_L$ represent the weight values corresponding to the encoding signals of the subsequent pipeline stages; and $cal_{n+1}$~$cal_N$ represent the correction values of the correction pipeline stages in the subsequent pipeline stage.

In another optional implementation, the error estimation circuit is configured for counting the correction value of the comparator according to the following equation: calc(i)=avg (err(i,0))−avg(err(i,1)), where calc(i) represents the correction value corresponding to the output signal of the i-th comparator in the n-th correction pipeline stage, avg(err(i, 0)) represents the average value of the determined error amounts of the i-th comparator in the n-th correction pipeline stage when the actual output signal of the i-th comparator is 0; and avg(err(i,1)) represents the average value of the determined error amounts of the i-th comparator in the n-th correction pipeline stage when the actual output signal of the i-th comparator is 1.

In another optional implementation, the error estimation circuit is configured for determining the correction value of the correction pipeline stage according to the following equation:

$$cal_n = \sum_{i=1}^{C_n} calc(i) \times mux_i,$$

where $cal_n$ represents the correction value of the n-th correction pipeline stage, $C_n$ represents the number of comparators in the n-th correction pipeline stage, $calc(i)$ represents the correction value corresponding to the output signal of the i-th comparator in the n-th correction pipeline stage, and $mux_i$ represents the actual output signal of the i-th comparator in the n-th correction pipeline stage.

In another optional implementation, the MUX circuit is configured for: when the output signal of a comparator in the correction pipeline stage becomes stable within the preset time, selecting the output signal of the comparator as the actual output signal of the comparator, otherwise, selecting the output signal of the random level generation circuit as the actual output signal of the comparator.

In another optional implementation, the level edge detection circuit is configured for: when detecting that the output signal of a comparator in the correction pipeline stage is not stable within the preset time, setting a corresponding flag signal, and when detecting that the output signal of a comparator in the correction pipeline stage becomes stable within the preset time, resetting a corresponding flag signal; the MUX circuit is configured for, when the flag signal is set, selecting the output signal of a corresponding random level generation circuit as the actual output signal of the comparator, and when the flag signal is reset, selecting the output signal of a corresponding comparator as the actual output signal of the comparator; and the error estimation circuit is configured for: with respect to each comparator in the correction pipeline stage the flag signal of which is set, determining the error amount of the comparator this time according to the actual output signal of the comparator and the encoding signal and the correction value signal of the subsequent pipeline stage; counting the correction value corresponding to the output signal of the comparator according to the determined error amounts; and after counting the correction values corresponding to the output signals of the comparators in the correction pipeline stage, determining the correction value of the correction pipeline stage according to the correction values corresponding to the output signals of the comparators in the correction pipeline stage.

In another optional implementation, the error estimation circuit is configured for: with respect to each comparator in the correction pipeline stage the flag signal of which is set, determining the error amount of the comparator this time according to the actual output signal of the comparator and the encoding signal and the correction value signal of the subsequent pipeline stage; incrementing the set number of the flag signal corresponding to the comparator by 1, and determining whether the set number of the flag signal corresponding to the comparator is equal to a preset threshold number; if yes, counting the correction value corresponding to the output signal of the comparator according to the determined error amounts.

In another optional implementation, the device further comprises a correction value storage circuit for storing the correction values of the correction pipeline stages.

In another optional implementation, the output value corrected by the pipeline analog-to-digital converter is:

$$D_{out} = \sum_{n=1}^{L} a_n \cdot b_n + \sum_{n=1}^{N} cal_n,$$

where $a_1 \sim a_L$ respectively represent the encoding signals of the pipeline stages in the pipeline analog-to-digital converter, $b_1 \sim b_L$ respectively represent the weight values corresponding to the encoding signals of the pipeline stages in the pipeline analog-to-digital converter, and $cal_1 \sim cal_N$ respectively represent the correction values of the correction pipeline stages in the pipeline analog-to-digital converter.

The beneficial effects of the present disclosure are as follows.

Compared to the fact that the traditional correction method cannot track the change of the non-ideal properties and mismatch errors of the correction device over time and the surrounding environment in real time and there may be certain deviation between the measured and extracted error information and the actual operation error information, the present disclosure can track the change of the non-ideal properties and mismatch errors of the correction device over time and the surrounding environment in real time without interrupting the normal operation of the pipeline ADC and correct the non-continuous points in the transmission curve, and the correction value is closer to the actual situation, which merely requires to add a few digital circuits in the original circuit, makes the best of the convenience brought by the progress of the current CMOS process and the increasing shrink of the feature size with low implementation complexity and can be designed flexibly according to the redundant encoding structure of the pipeline ADC independent of the particular implementation structure of the operation amplifier and comparator in the ADC, and thus can effectively improve the performance and accuracy of the pipeline ADC.

DETAILED DESCRIPTION

In order to make a person skilled in the art better understand the technical solution in the embodiments of the present disclosure and make the above objects, features and advantages of the embodiments of the present disclosure more clear and understandable, the technical solution in the embodiments of the present disclosure will be described in further detail with reference to the accompanying drawings.

In the description of the present disclosure, unless stated and defined otherwise, it should be noted that the term "connection" should be understood broadly, for example, it can be a mechanical connection or an electrical connection and may also be the internal communication of two elements, may also be a direct connection, and may also be an indirect connection through an intermediate medium, and those skilled in the art can understand the particular meaning of the above term according to the particular situation.

Figure 1:
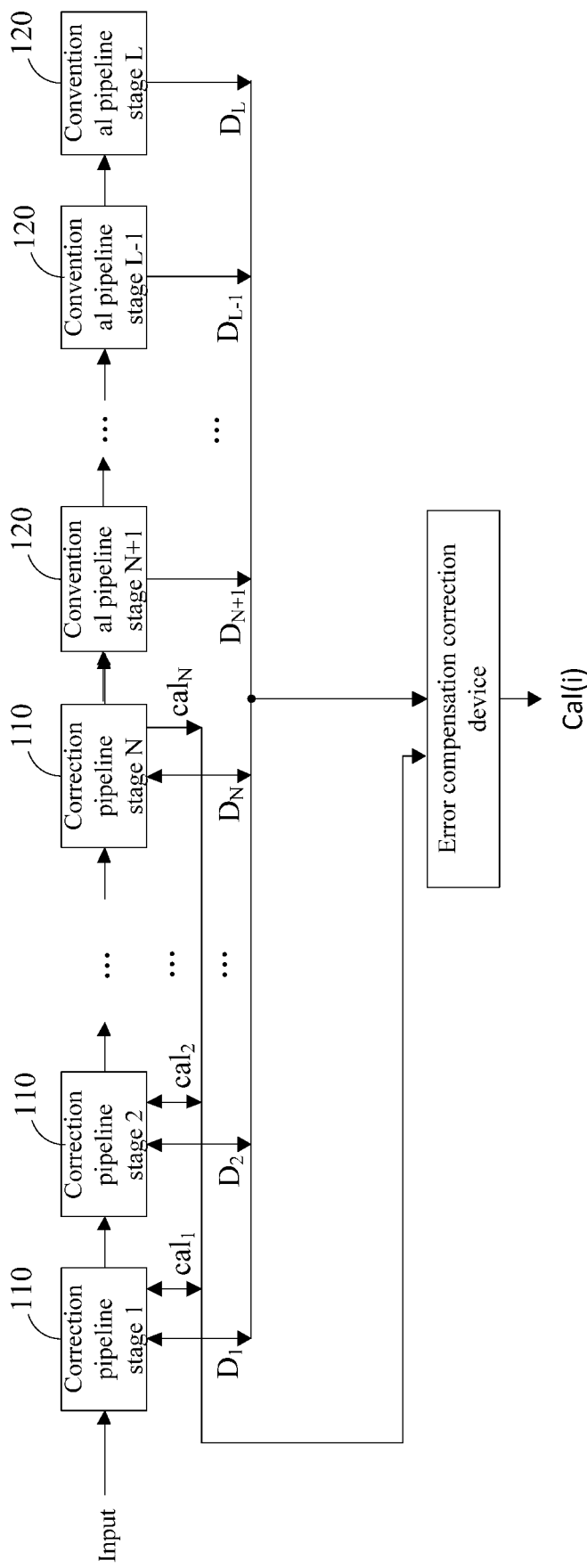
FIG. 1 is a circuit diagram of an embodiment of an error compensation correction device for a pipeline analog-to-digital converter in the present disclosure.
Figure 2:
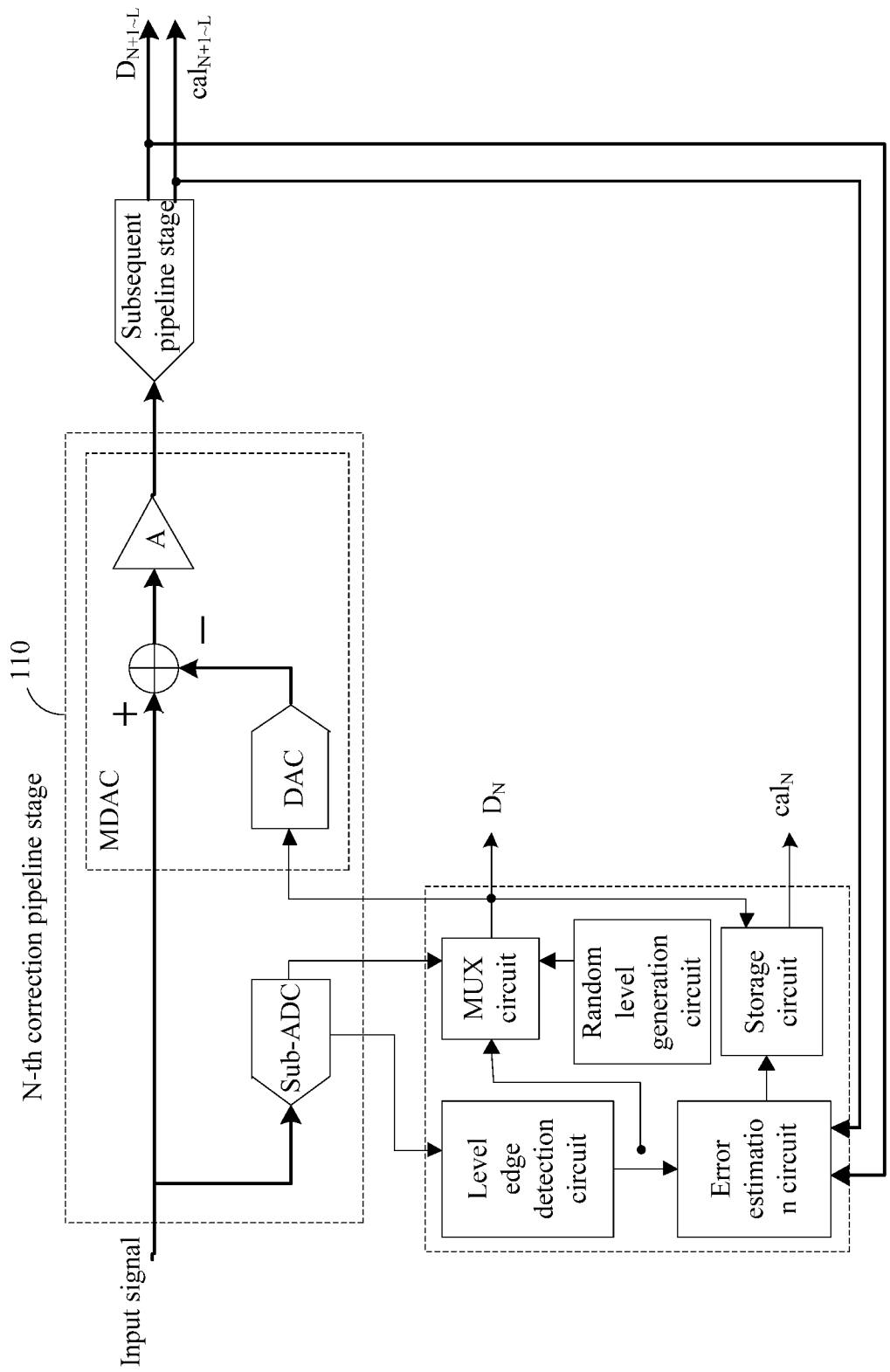
FIG. 2 is a circuit diagram of an embodiment of a correction pipeline stage in FIG. 1.

FIG. 1 is a circuit diagram of an embodiment of an error compensation correction device for a pipeline analog-to-digital converter in the present disclosure. The error compensation correction device for a pipeline analog-to-digital converter may include correction pipeline stages 110 and conventional pipeline stages 120. As shown in FIG. 2, for each correction pipeline stage 110, a corresponding error estimation circuit 130, level edge detection circuit 130, random level generation circuit 140 and MUX (multiplexer, data selector) circuit 160 are provided. The level edge detection circuit 140 may detect whether an output signal of a comparator in the correction pipeline stage 110 is stably output within a preset time; the MUX circuit 160 may select the output signal of the comparator or an output signal of the random level generation circuit 150 as an actual output signal of the comparator according to the detection result; and the error estimation circuit 130 may estimate the correction value of the correction pipeline stage 110 according to the actual output signal and an encoding signal and a correction value signal of a subsequent pipeline stage when the output signal of the comparator is not stable within the preset time.

In this embodiment, the pipeline analog-to-digital converter includes a plurality of pipeline stages. The first N pipeline stages may be configured as correction pipeline stages and the subsequent remaining pipeline stages may be configured as conventional pipeline stages. Each correction pipeline stage may output an encoding signal $D_i$ and a correction value signal $cal_i$, and each conventional pipeline stage may output the encoding signal $D_i$. Referring to FIG. 2, each conventional pipeline stage in the pipeline analog-to-digital converter may include one sub-ADC and one MDAC, and each correction pipeline stage is also provided with a corresponding error estimation circuit 130, level edge detection circuit 140, random level generation circuit 150 and MUX circuit 160 in addition to including one ADC and one MDAC. The random level generation circuit 150 may randomly generate two corresponding digital levels "0" and "1" under the control of a sampling clock of a corresponding correction pipeline 110.

Figure 3:
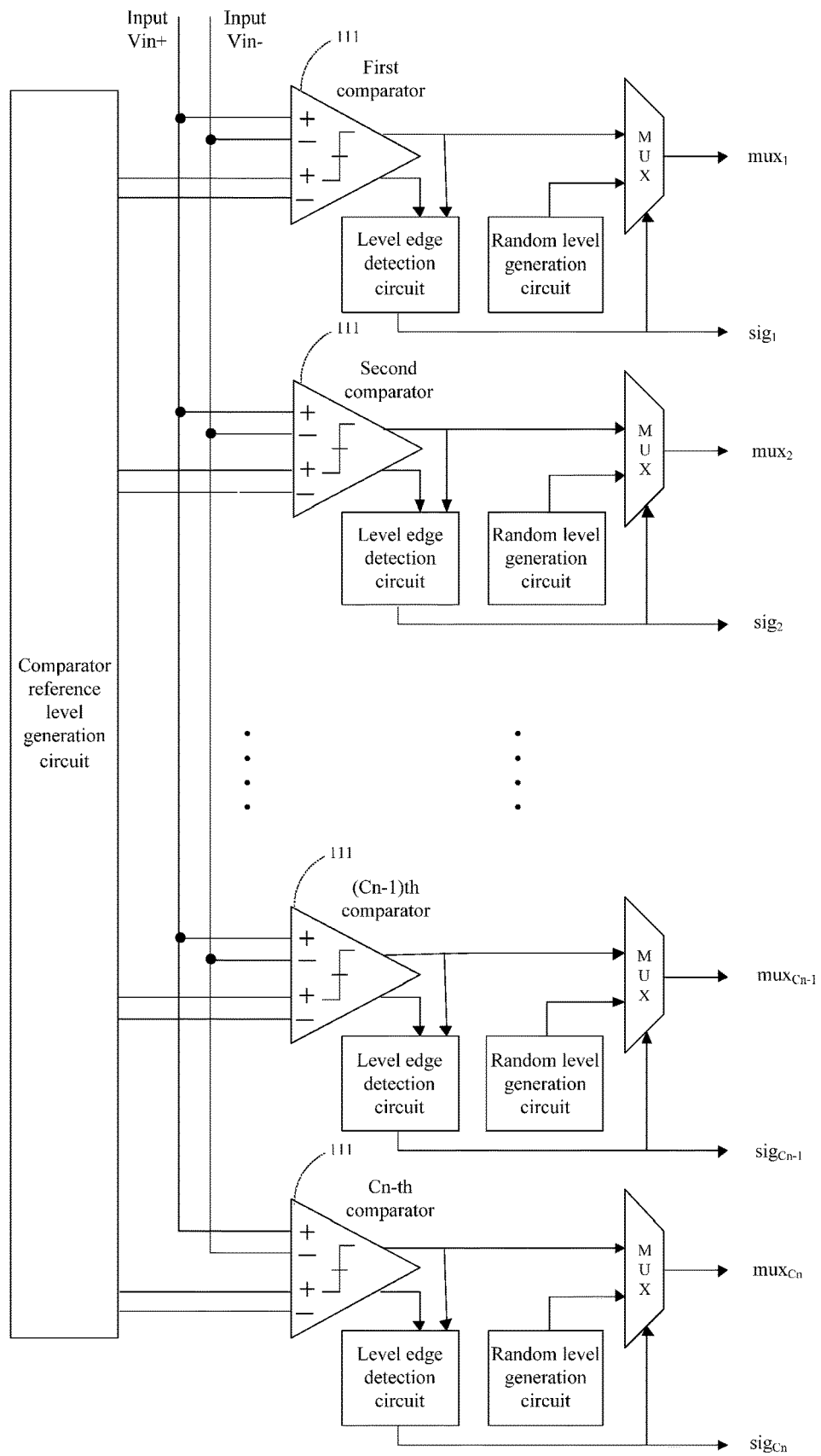
FIG. 3 is a connection diagram of various comparators to a level edge detection circuit, a random level generation circuit and an MUX circuit of the sub-ADC in the correction pipeline stage in FIG. 1.

It is found after researches that when a comparator compares two levels, if these two levels differ a little, then the output speed is slow, and if these two levels differ a lot, then the output speed is fast. Thus, in an optional implementation, referring to FIG. 3, for each comparator 111 of the sub-ADCs in the correction pipeline stages, taking the i-th comparator of the sub-ADC of the n-th correction pipeline stage as an example, this comparator 111 can compare an input signal to a reference level, when the level edge detection circuit 140 detects that an output signal of the comparator 111 does not stabilize output within a preset time, it indicates that the input signal of the comparator 111 differs from the reference level a little, and at this moment, the MUX circuit 160 may take an output signal of the random level generation circuit 150 as an actual output signal of the comparator 111. When the level edge detection circuit 140 detects that the output signal of the comparator 111 becomes stable within the preset time, it indicates that the input signal of the comparator 111 differs from the reference level a lot, and at this moment, the MUX circuit 160 may take the output signal of the comparator 111 as the actual output signal of the comparator 111. It should be noted that the comparator 111 stabilizes the output may refer to that the signal output thereby is a constant signal.

When the level edge detection circuit 140 detects that the output signal of at least one comparator 111 in a corresponding correction pipeline stage 110 is not stable within the preset time, then the error estimation circuit 130 is enabled to operate. The error estimation circuit 130 may, with respect to each comparator 111 in the correction pipeline stage 110 the output signal of which is not stable within the preset time, determine the error amount of the output of the comparator according to the actual output signal of the comparator and the encoding signal and the correction value signal of the subsequent pipeline stage; count the correction value corresponding to the output signal of the comparator according to the determined error amounts; and after counting the correction values corresponding to the output signals of the comparators in the correction pipeline stage, the error estimation circuit 130 may determine the correction value of the correction pipeline stage according to the correction values corresponding to the output signals of the comparators in the correction pipeline stage.

When the error estimation circuit 130 is enabled to operate, the error amount of a corresponding comparator in the correction pipeline stage 110 can be calculated according to the following equation:

$$err(i, mux_i) = err(i, mux_i) + \sum_{m=n+1}^{L} a_m \cdot b_m + \sum_{m=n+1}^{N} cal_m, \quad (1)$$

where $err(i, mux_i)$ at the left of the equation represents the error amount determined by the i-th comparator in the n-th correction pipeline stage this time when the actual output signal of the i-th comparator is $mux_i$; $err(i, mux_i)$ at the right of the equation represents the error amount determined by the i-th comparator in the n-th correction pipeline stage the last time when the actual output signal of the i-th comparator is $mux_i$; $a_{n+1} \sim a_L$ represent the encoding signals of the subsequent pipeline stages after the n-th correction pipeline stage; $b_{n+1} \sim b_L$ represent the weight values corresponding to the encoding signals of the subsequent pipeline stages; and $cal_{n+1} \sim cal_N$ represent the correction values of the correction pipeline stages in the subsequent pipeline stage.

After calculating the error amounts of various comparators with a preset number of times, the error estimation circuit 130 may count the correction value corresponding to the output signal of each comparator respectively according to the following equation:

$$calc(i) = avg(err(i, 0)) - avg(err(i, 1)) \quad (2),$$

where $calc(i)$ represents the correction value of the i-th comparator in the n-th correction pipeline stage, $avg(err(i, 0))$ represents the average value of the determined error amounts of the i-th comparator in the n-th correction pipeline stage when the actual output signal of the i-th comparator is 0; and avg(err(i,1)) represents the average value of the determined error amounts of the i-th comparator in the n-th correction pipeline stage when the actual output signal of the i-th comparator is 1.

After counting the correction values corresponding to the output signals of the comparators, the error estimation circuit 130 may determine the correction value of the correction pipeline stage according to the following equation:

$$cal_n = \sum_{i=1}^{C_n} calc(i) \times mux_i, \quad (3)$$

where $cal_n$ represents the correction value of the n-th correction pipeline stage, $C_n$ represents the number of comparators in the n-th correction pipeline stage, calc(i) represents the correction value corresponding to the output signal of the i-th comparator in the n-th correction pipeline stage, and $mux_i$ represents the actual output signal of the i-th comparator in the n-th correction pipeline stage.

After determining the correction values of the correction pipeline stages, the output value corrected by the pipeline analog-to-digital converter may be:

$$D_{out} = \sum_{n=1}^{L} a_n \cdot b_n + \sum_{n=1}^{N} cal_n, \quad (4)$$

where $a_1$~$a_L$ respectively represent the encoding signals of the pipeline stages in the pipeline analog-to-digital converter, $b_1$~$b_L$ respectively represent the weight values corresponding to the encoding signals of the pipeline stages in the pipeline analog-to-digital converter, and $cal_1$~$cal_N$ respectively represent the correction values of the correction pipeline stages in the pipeline analog-to-digital converter.

It can be seen from the above embodiment that, compared to the fact that the traditional correction method cannot track the change of the non-ideal properties and mismatch errors of the correction device over time and the surrounding environment in real time and there may be certain deviation between the measured and extracted error information and the actual operation error information, the present disclosure can track the change of the non-ideal properties and mismatch errors of the correction device over time and the surrounding environment in real time without interrupting the normal operation of the pipeline ADC and correct the non-continuous points in the transmission curve, and the correction value is closer to the actual situation, which merely requires to add a few digital circuits in the original circuit, makes the best of the convenience brought by the progress of the current CMOS process and the increasing shrink of the feature size with low implementation complexity and can be designed flexibly according to the redundant encoding structure of the pipeline ADC independent of the particular implementation structure of the operation amplifier and comparator in the ADC, and thus can effectively improve the performance and accuracy of the pipeline ADC.

In addition, for various comparators of each correction pipeline stage in the pipeline analog-to-digital converter, corresponding flag signals may be provided respectively and each flag signal is correspondingly provided with a set number. The initial value of the set number may be 0. The initial values of the error amounts and correction values of various comparators of the sub-ADC in the correction pipeline stage and the correction values of the correction pipeline stages may all be 0.

For each comparator 111 of the sub-ADC in the correction pipeline stage 110, taking the i-th comparator of the sub-ADC in the n-th correction pipeline stage, the comparator 111 may compare an input signal to a reference level, when the level edge detection circuit 140 detects that an output signal of the comparator 111 does not stabilize output within a preset time, it indicates that the input signal of the comparator 111 differs from the reference level a little, and at this moment, a corresponding flag signal $sig_i$ may be set, where $sig_i$ represents the flag signal corresponding to the i-th comparator in the n-th correction pipeline; when the level edge detection circuit 140 detects that the output signal of the comparator 111 becomes stable within the preset time, it indicates that the input signal of the comparator 111 differs from the reference level a lot, and at this moment, the corresponding flag signal $sig_i$ may be reset. When the flag signal $sig_i$ of the comparator 111 is set, the MUX circuit 160 may take an output signal of the random level generation circuit 150 as the actual output signal of the comparator 111; and when the flag signal $sig_i$ of the comparator 111 is reset, the MUX circuit 160 may take the output signal of the comparator 111 as the actual output signal of the comparator 111.

Figure 4:
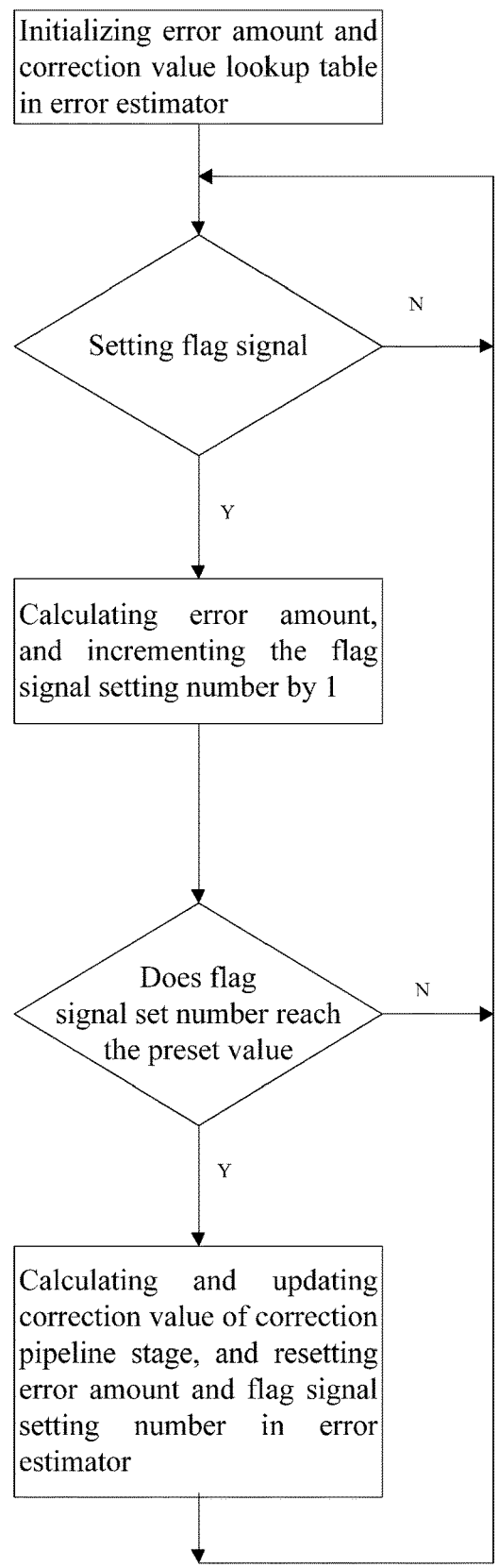
FIG. 4 is a flowchart of an error estimation circuit updating the correction value of the correction pipeline stage.
Figure 5A:
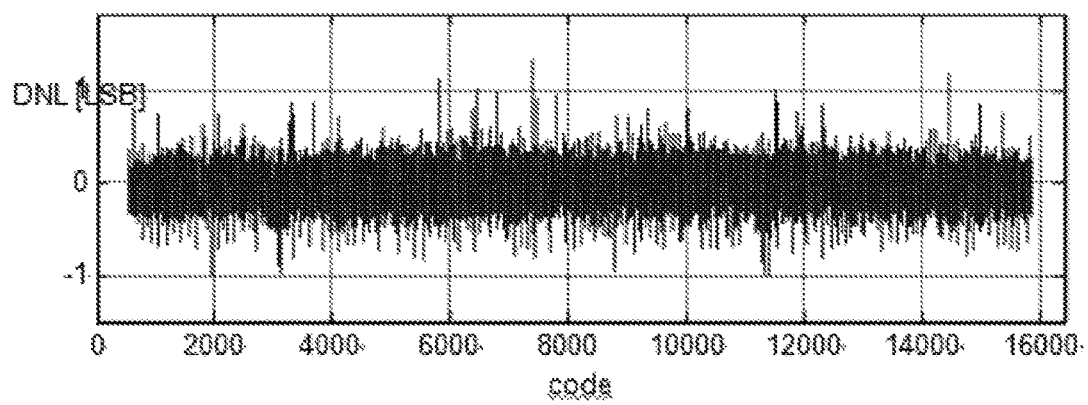
FIGS. 5a to 5d are schematic diagrams of static performance simulation before and after correction of the pipeline analog-to-digital converter in the present disclosure.
Figure 5B:
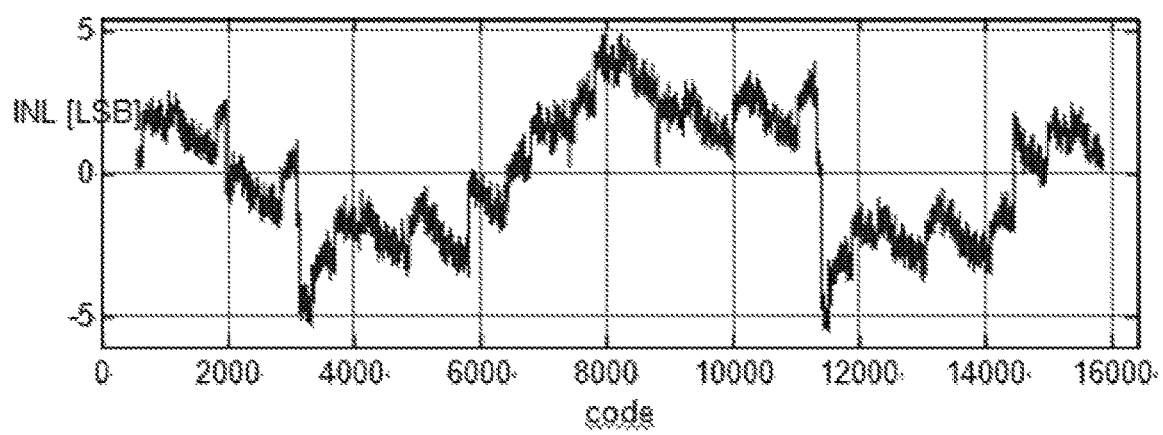
Figure 5C:
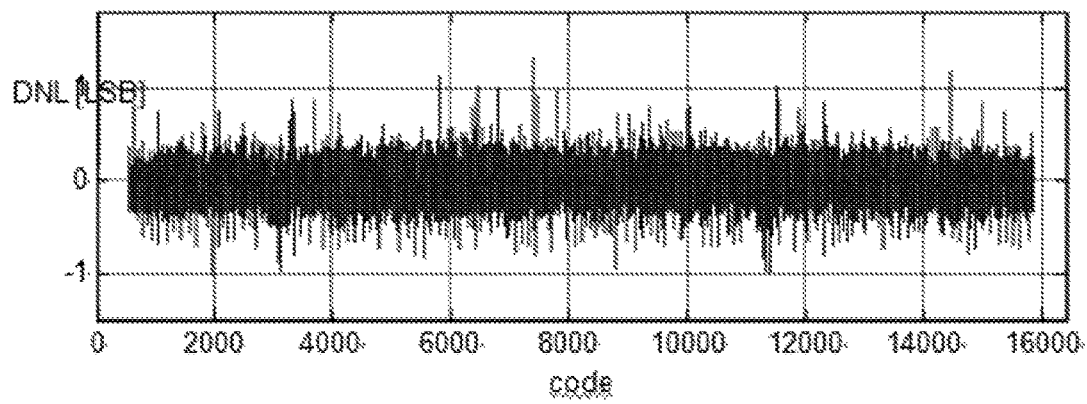
Figure 5D:
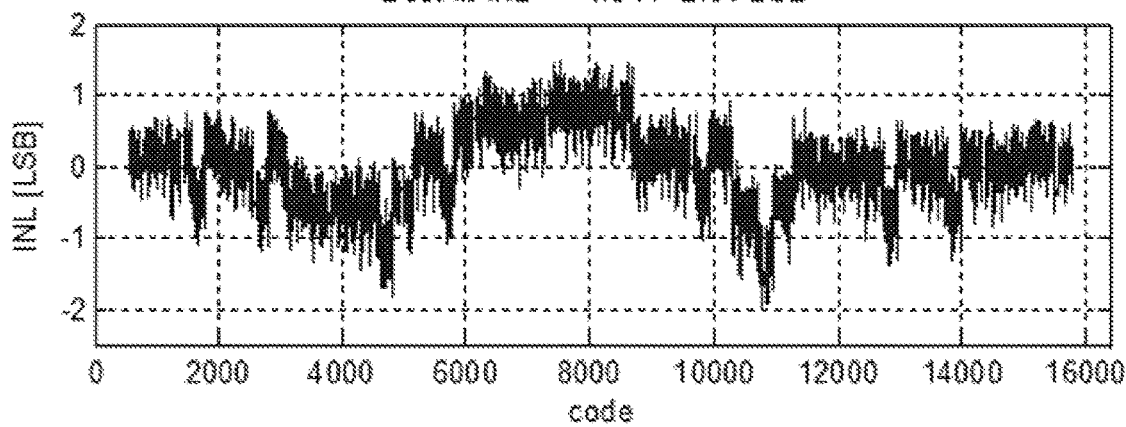
Figure 6A:
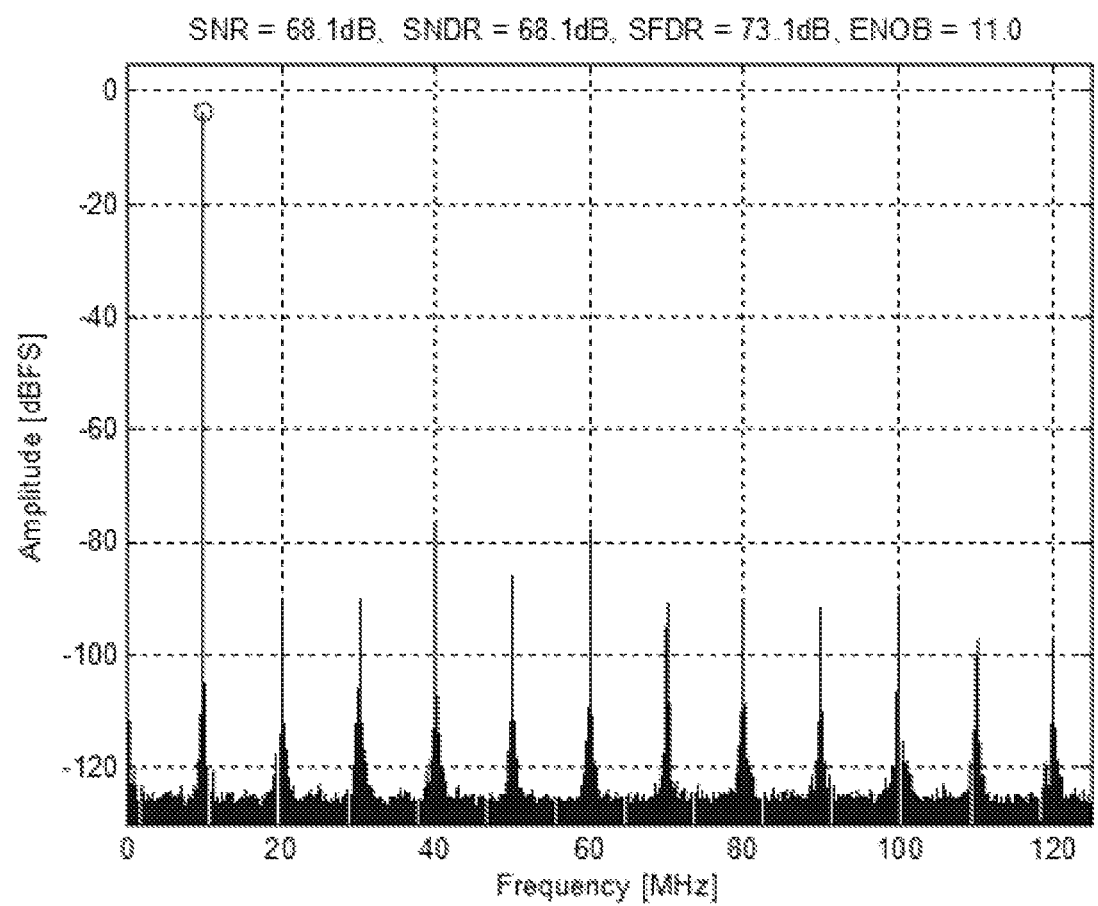
FIGS. 6a and 6b schematic diagrams of dynamic performance simulation before and after correction of the pipeline analog-to-digital converter in the present disclosure.
Figure 6B:
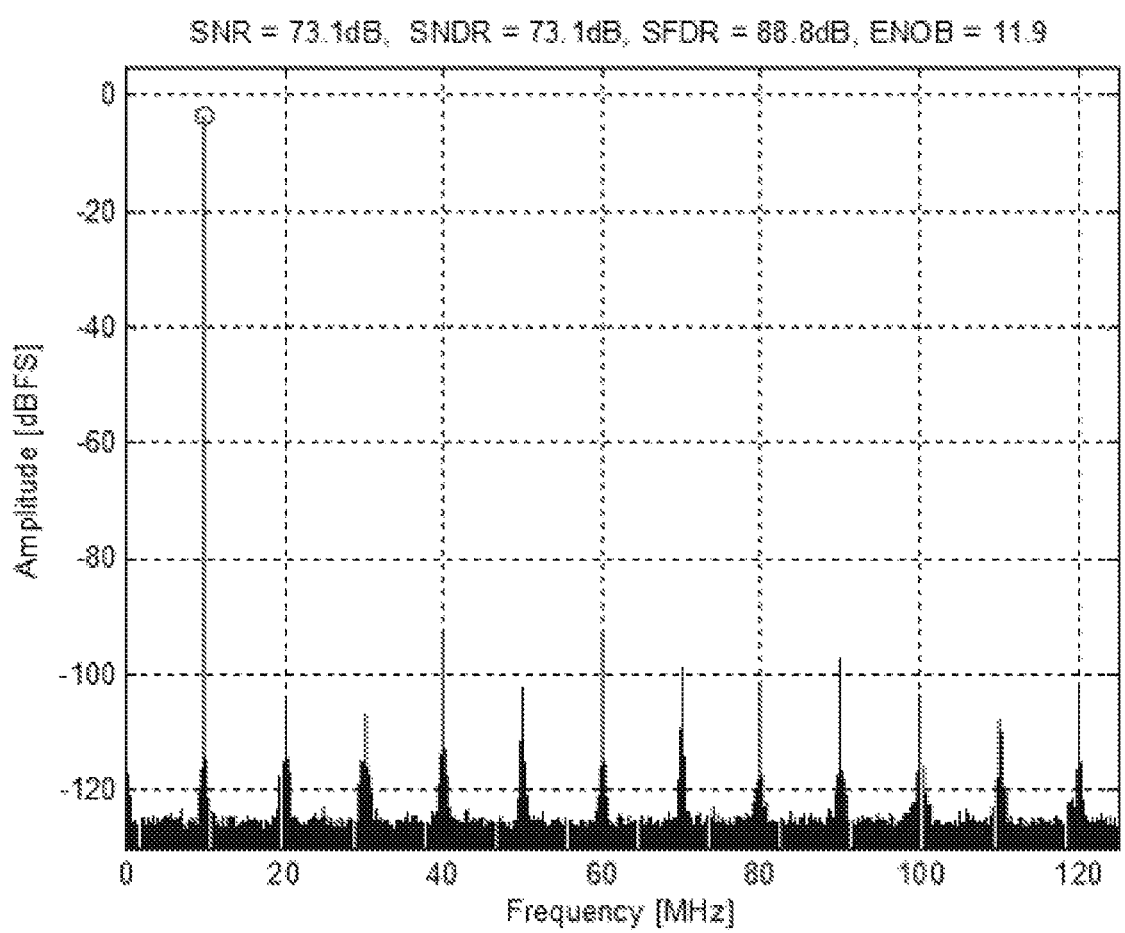

When the level edge detection circuit 140 detects that the flag signal of at least one comparator 111 in a corresponding correction pipeline stage 110 is set, then the error estimation circuit 130 is enabled to operate. For each comparator 111 in the correction pipeline stage 110 the flag signal of which is set, the error estimation circuit 130 may, as shown in FIG. 4, first determine the error amount of this output of the comparator according to equation (1) and increment the flag signal corresponding to the comparator by 1 and then determine whether the set number of the flag signal corresponding to the comparator is equal to a preset number threshold, if yes, then count the correction value corresponding to the output signal of the comparator according to equation (2), otherwise, continue to perform the above steps. After counting the correction values corresponding to the output signals of the comparators in the correction pipeline stage, the error estimation circuit 130 may determine the correction value of the correction pipeline stage, update the correction value of the correction pipeline stage and store same. Then, the set numbers of the flag signals corresponding to various comparators are cleared and the error amounts of various comparators stored in the storage circuit are cleared to repeat the above correction value update process of the correction pipeline stage. It should be noted that the above the pipeline stages may output an encoding signal in a redundant encoding manner.

In an optional implementation, taking a 14-bit 250 MHZ sampling rate pipeline ADC as an example, the redundant encoding method is 3.5-2.5-1.5-1.5-1.5-1.5-1.5-4 bit, including 8 pipeline stages, the first two pipeline stages are set as correction pipeline stages to perform estimation and correction of background non-ideal parameters, the remaining pipeline stages are conventional pipeline stages, the last pipeline stage is 4 bit flash ADC, the particular values of relevant parameters are as follows, L=8, N=2, C1=14, C2=6, the set number value of the flag signal is 65 k, a non-ideal parameter is added, a sine signal is input, real-time correction is performed in the above manner, the simulation results are as shown in FIGS. 5a to 5d and FIGS. 6a and 6b, the performance of the pipeline ADC after correction is improved obviously, INL after correction is improved by about 3.5 LSB than before correction, the significant bit (ENOB) after correction is improved by 0.9 LSB, and the dynamic performance SFDR after correction is improved about 15 dB.

After considering the description and practicing the present disclosure disclosed herein, other implementations of the present disclosure may easily occur to those skilled in the art. The present application is intended to cover any modifications, uses or adaptive changes of the present disclosure, and these modifications, uses or adaptive changes follow the general principles of the present disclosure and include common knowledge or customary technical means in the technical field which is not disclosed in the present disclosure. The description and embodiments shall be deemed merely illustrative, and the real scope and spirit of the present disclosure is set forth in the following claims.

It shall be understood that the present disclosure is not limited to the precise structure described above and illustrated in the drawings and can be modified and varied without departing the scope thereof. The scope of the present disclosure is merely limited by the appended claims.

What is claimed is:

1. An error compensation correction device for a pipeline analog-to-digital converter, comprising correction pipeline stages and conventional pipeline stages, and with a corresponding error estimation circuit, level edge detection circuit, random level generation circuit and MUX circuit being provided for each correction pipeline stage, wherein the level edge detection circuit is configured for detecting whether an output signal of a comparator in the correction pipeline stage is stably output within a preset time; the MUX circuit is configured for selecting the output signal of the comparator or an output signal of the random level generation circuit as an actual output signal of the comparator according to a detection result detected by the level edge detection circuit; and the error estimation circuit is configured for estimating a correction value of the correction pipeline stage according to the actual output signal and an encoding signal and a correction value signal of a subsequent pipeline stage when the output signal of the comparator is not stable within the preset time.

2. The device according to claim 1, wherein the error estimation circuit is configured for: with respect to each comparator the output signal of which in the correction pipeline stage is not stable within the preset time, determining an error amount of this output of the comparator according to the actual output signal of the comparator and the encoding signal and the correction value signal of the subsequent pipeline stage; counting the correction value corresponding to the output signal of the comparator according to the error amount determined by the error estimation circuit; and after counting the correction values corresponding to the output signals of the comparators in the correction pipeline stage, determining the correction value of the correction pipeline stage according to the correction values corresponding to the output signals of the comparators in the correction pipeline stage.

3. The device according to claim 2, wherein the error estimation circuit is configured for determining the error amount of the comparator according to the following equation:

$$err(i, mux_i) = err(i, mux_i) + \sum_{m=n+1}^{L} a_m \cdot b_m + \sum_{m=n+1}^{N} cal_m,$$

where $err(i, mux_i)$ at the left of the equation represents the error amount determined by the i-th comparator in the n-th correction pipeline stage this time when the actual output signal of the i-th comparator is $mux_i$; $err(i, mux_i)$ at the right of the equation represents the error amount determined by the i-th comparator in the n-th correction pipeline stage the last time when the actual output signal of the i-th comparator is $mux_i$; $a_{n+1} \sim a_L$ represent the encoding signals of the subsequent pipeline stages after the n-th correction pipeline stage; $b_{n+1} \sim b_L$ represent the weight values corresponding to the encoding signals of the subsequent pipeline stages; and $cal_{n+1} \sim cal_N$ represent the correction values of the correction pipeline stages in the subsequent pipeline stage.

4. The device according to claim 2, wherein the error estimation circuit is configured for counting the correction value of the comparator according to the following equation:

calc(i)=avg(err(i,0))–avg(err(i,1)), where calc(i) represents the correction value corresponding to the output signal of the i-th comparator in the n-th correction pipeline stage; avg(err(i,0)) represents an average value of the determined error amounts of the i-th comparator in the n-th correction pipeline stage when the actual output signal of the i-th comparator is 0; and avg(err(i,1)) represents the average value of the determined error amounts of the i-th comparator in the n-th correction pipeline stage when the actual output signal of the i-th comparator is 1.

5. The device according to claim 2, wherein the error estimation circuit is configured for determining the correction value of the correction pipeline stage according to the following equation:

$$cal_n = \sum_{i=1}^{C_n} calc(i) \times mux_i,$$

where $cal_n$ represents the correction value of the n-th correction pipeline stage, $C_n$ represents the number of comparators in the n-th correction pipeline stage, calc(i) represents the correction value corresponding to the output signal of the i-th comparator in the n-th correction pipeline stage, and $mux_i$ represents the actual output signal of the i-th comparator in the n-th correction pipeline stage.

6. The device according to claim 1, wherein the MUX circuit is configured for, when the output signal of a comparator in the correction pipeline stage becomes stable within the preset time, selecting the output signal of the comparator as the actual output signal of the comparator, otherwise, selecting the output signal of the random level generation circuit as the actual output signal of the comparator.

7. The device according to claim 2, wherein the level edge detection circuit is configured for, when detecting that the output signal of a comparator in the correction pipeline stage is not stable within the preset time, setting a corresponding flag signal, and when detecting that the output signal of a comparator in the correction pipeline stage becomes stable within the preset time, resetting a corresponding flag signal;

the MUX circuit is configured for, when the flag signal is set, selecting the output signal of a corresponding random level generation circuit as the actual output signal of the comparator, and when the flag signal is reset, selecting the output signal of a corresponding comparator as the actual output signal of the comparator; and the error estimation circuit is configured for: with respect to each comparator in the correction pipeline stage the flag signal of which is set, determining the error amount of the comparator this time according to the actual output signal of the comparator and the encoding signal and the correction value signal of the subsequent pipeline stage; counting the correction value corresponding to the output signal of the comparator according to the determined error amounts; and after counting the correction values corresponding to the output signals of the comparators in the correction pipeline stage, determining the correction value of the correction pipeline stage according to the correction values corresponding to the output signals of the comparators in the correction pipeline stage.

8. The device according to claim 7, wherein the error estimation circuit is configured for: with respect to each comparator in the correction pipeline stage the flag signal of which is set, determining the error amount of the comparator this time according to the actual output signal of the comparator and the encoding signal and the correction value signal of the subsequent pipeline stage; incrementing the set number of the flag signal corresponding to the comparator by 1, and determining whether the set number of the flag signal corresponding to the comparator is equal to a preset threshold number; if yes, counting the correction value corresponding to the output signal of the comparator according to the determined error amounts.

9. The device according to claim 1, wherein the device further comprises a correction value storage circuit for storing the correction values of the correction pipeline stages.

10. The device according to claim 1, wherein the corrected output value of the pipeline analog-to-digital converter is:

$$D_{out} = \sum_{n=1}^{L} a_n \cdot b_n + \sum_{n=1}^{N} cal_n,$$

where $a_1 \sim a_L$ respectively represent the encoding signals of the pipeline stages in the pipeline analog-to-digital converter, $b_1 \sim b_L$ respectively represent a weight values corresponding to the encoding signals of the pipeline stages in the pipeline analog-to-digital converter, and $cal_1 \sim cal_N$ respectively represent the correction values of the correction pipeline stages in the pipeline analog-to-digital converter.

* * * * *